United States Patent
Morimoto et al.

[11] Patent Number: 6,009,113
[45] Date of Patent: Dec. 28, 1999

[54] SEMICONDUCTOR LASER DEVICE HAVING CLAD AND CONTACT LAYERS RESPECTIVELY DOPED WITH MG AND METHOD FOR FABRICATING THE SAME

[75] Inventors: Taiji Morimoto, Nara; Zenkichi Shibata; Takashi Ishizumi, both of Kitakatsuragi-gun; Keisuke Miyazaki, Ikoma; Toshio Hata, Nara; Yoshinori Ohitsu, Yamatokooriyama, all of Japan

[73] Assignee: Sharp Kabushiki Kaisha, Osaka, Japan

[21] Appl. No.: 09/210,564

[22] Filed: Dec. 15, 1998

Related U.S. Application Data

[62] Division of application No. 08/861,762, May 22, 1997, Pat. No. 5,932,004, which is a continuation of application No. 08/497,319, Jun. 30, 1995, abandoned.

[30] Foreign Application Priority Data

Jul. 18, 1994 [JP] Japan ..................................... 6-165059

[51] Int. Cl.⁶ ..................................................... H01S 3/19
[52] U.S. Cl. .................................. 372/46; 372/43; 372/45
[58] Field of Search ................................. 372/43, 44, 45, 372/46, 50

[56] References Cited

U.S. PATENT DOCUMENTS

| | | | |
|---|---|---|---|
| 4,088,514 | 5/1978 | Hara et al. | 148/171 |
| 4,255,755 | 3/1981 | Itoh et al. | 257/18 X |
| 4,692,194 | 9/1987 | Nishizawa | 437/120 |
| 4,716,129 | 12/1987 | Taneya et al. | 437/96 |
| 4,835,117 | 5/1989 | Ohba et al. | 437/129 |
| 5,079,184 | 1/1992 | Hatano et al. | 437/107 |
| 5,164,951 | 11/1992 | Kagawa et al. | 372/46 |
| 5,369,658 | 11/1994 | Ikawa et al. | 372/45 |
| 5,932,004 | 8/1999 | Morimoto et al. | 117/61 |
| 5,932,896 | 8/1999 | Sugiura et al. | 257/94 |

FOREIGN PATENT DOCUMENTS

| | | | |
|---|---|---|---|
| 0160490 | 11/1985 | European Pat. Off. | 437/129 X |
| 0412582 A1 | 2/1991 | European Pat. Off. | 437/129 X |
| 61-276316 | 12/1986 | Japan | 437/129 X |
| 5-102604 | 4/1993 | Japan | 437/129 X |

OTHER PUBLICATIONS

Imafuji et al, "600 mW CW Single–Mode GaAlAs Tiple–Quantum–Well Laser with a New Index Guided Structure", IEEE Journal of Quantum Electronics Jun. 29, 1993, No. 6, New York, pp. 1889–1894.

Patent Abstracts of Japan, vol. 13, No. 413 (E-820) (3761) Sep. 12, 1989 & JP-A-01 152789 (Mitsubishi Electric Corp.) Jun. 15, 1989.

M. Okajima et al., "A New Transverse–Mode Stabilized GaAlAs Laser with a Slab–Coupled Waveguide Grown by MOCVD", Extended Abstracts of the 16th (1984 International) Conference on Solid State Devices and Materials, Kobe, 1984, pp. 153–156.

*Primary Examiner*—Brian Healy
*Attorney, Agent, or Firm*—Nixon & Vanderhye, P.C.

[57] ABSTRACT

A semiconductor laser device having high performance, low operating voltage, and long service life, and a method for fabricating the same are provided. A semiconductor multi-layer film including an active layer for use of laser beam oscillation is stacked on a substrate. Then a clad layer composed of p-type AlGaAs doped with a p-type impurity Mg, and a contact layer composed of p-type GaAs doped also with Mg are grown by an LPE growth process, and further a surface layer having a high-resistance portion present in the contact layer and low in carrier concentration is removed. The active layer for use of laser beam oscillation is arranged in a substantially center of an end surface from which the laser beam is emitted.

2 Claims, 8 Drawing Sheets

Fig.8A    PRIOR    ART
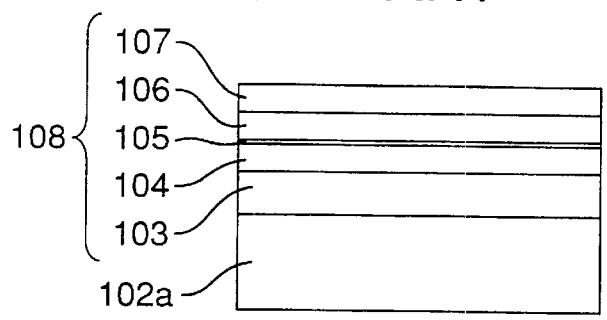
Fig.8B    PRIOR    ART
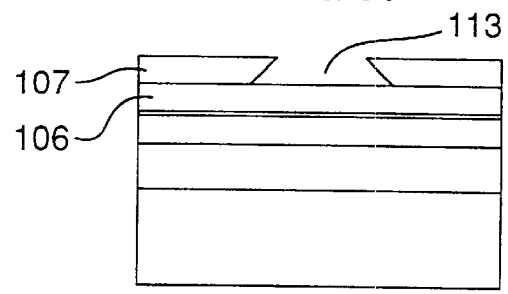
Fig.8C    PRIOR    ART
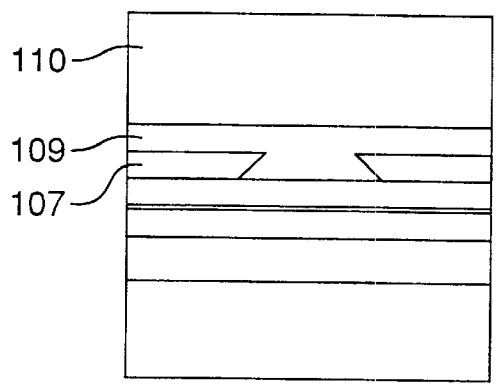
Fig.8D    PRIOR    ART
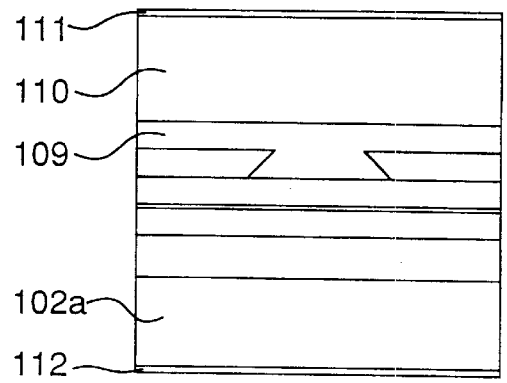

SEMICONDUCTOR LASER DEVICE HAVING CLAD AND CONTACT LAYERS RESPECTIVELY DOPED WITH MG AND METHOD FOR FABRICATING THE SAME

This application is a divisional of Ser. No. 08/861,762 filed May 22, 1997, U.S. Pat. No. 5,932,004, which is a continuation of Ser. No. 08/497,319 filed Jun. 30, 1995 abandoned.

BACKGROUND OF THE INVENTION

1. Field of the Invention

The present invention relates to a semiconductor laser device to be used in minidisc players and the like, and a method for fabricating the same. More specifically, the present invention relates to a semiconductor laser device having high performance, low operating voltage, and long service life, and also to a method for fabricating the same.

2. Description of the Prior Art

A conventional semiconductor laser device 101 is constructed in the following way, as shown in FIG. 7. A semiconductor multilayer film 108 is stacked on a substrate 102 composed of, for example, n-type GaAs, the semiconductor multilayer film 108 being comprised of a buffer layer 103 composed of Se-doped n-type GaAs, a lower clad layer 104 composed of Se-doped n-type $Al_{0.5}Ga_{0.5}As$, an active layer 105 composed of $Al_{0.13}Ga_{0.87}As$, an upper clad layer 106 composed of Zn-doped p-type $Al_{0.5}Ga_{0.5}As$, and a current blocking layer 107 composed of Se-doped n-type AlGaAs. Further thereon stacked are a clad layer 109 composed of Zn-doped p-type $Al_{0.5}Ga_{0.5}As$ and a contact layer 110 composed of Zn-doped p-type GaAs, one by one. On top and bottom surfaces of the semiconductor laser device, formed are a p (positive) electrode 111 and an n (negative) electrode 112 composed of, for example, Au—Ge and Au—Zn.

The method for fabricating the above semiconductor laser device is shown in FIGS. 8A, 8B, 8C, and 8D. First, as shown in FIG. 8A, a semiconductor multilayer film 108 is grown one layer after another by an MOCVD (Metal Organic Chemical Vapor Deposition) process on a wafer substrate 102a composed of, for example, n-type GaAs, the semiconductor multilayer film 108 comprising a buffer layer (thickness 2 $\mu$m) 103 composed of Se-doped n-type GaAs, a lower clad layer (thickness 1 $\mu$m) 104 composed of Se-doped n-type $Al_{0.5}Ga_{0.5}As$, an active layer (thickness 0.08 $\mu$m) 105 composed of $Al_{0.13}Ga_{0.87}As$, an upper clad layer (thickness 0.3 $\mu$m) 106 composed of Zn-doped p-type $Al_{0.5}Ga_{0.5}As$, and a current blocking layer (thickness 1 $\mu$m) 107 composed of Se-doped n-type AlGaAs. Thereafter, as shown in FIG. 8B, a striped groove (top width approx. 4 $\mu$m) 113 is formed by etching so as to be bored through the current blocking layer 107.

Further thereon, as shown in FIG. 8C, a clad layer (thickness inside the striped groove 2 $\mu$m, thickness outside 1 $\mu$m) 109 composed of Zn-doped p-type $Al_{0.5}Ga_{0.5}As$ and a contact layer (thickness 45 $\mu$m) 110 composed of Zn-doped p-type GaAs are grown one by one by a liquid phase epitaxial growth process (hereinafter, referred to as LPE growth process). Finally, a p (positive) electrode 111 and an n (negative) electrode 112 composed of, for example, Au—Ge and Au—Zn are formed and thereafter the wafer is divided into individual semiconductor laser devices.

In the above method of fabricating a semiconductor laser device, the process using the LPE growth process is carried out by a growth slide board 115 made of carbon as shown in FIGS. 9A through 9D. As shown in FIG. 9A, a substrate 102b on which the semiconductor multilayer film has been grown is set at a recess of a base 116, while an LPE-grown clad-layer growth use fused liquid 117 and a contact-layer growth use fused liquid 118 are set at growth fused liquid sumps. The liquid phase epitaxial growth (hereinafter, referred to as LPE growth) is carried out while the temperature is gradually lowered. As shown in FIGS. 9B and 9C, a slider 120 is pulled by a slide bar 119 at a time point when a specified time or temperature is reached, so that the growth fused liquids 117, 118 are switched over. Finally, as shown in FIG. 9D, the slider 120 is further pulled so that the growth fused liquid 118 is removed from the substrate 102b. Thus, the growth is completed.

The above conventional semiconductor light-emitting device has had the following problems:

(1) A semiconductor laser device like the prior art example uses Zn as the p-type impurity for the LPE-grown clad layer and the contact layer. However, Zn has an high vapor pressure and therefore easy to evaporate such that even if it is charged in the growth fused liquid, its concentration in the fused liquid will not be stabilized.

(2) The aforementioned p-type impurity Zn is intensely diffused in the solid phase, being diffused into the lower semiconductor multilayer film during the growth at high temperature, affecting the carrier concentration. This causes deviations from the design structure of the semiconductor laser device and moreover leads to reduction in reproducibility.

(3) The contact layer of the semiconductor laser device such as shown in the prior art example is grown to a large thickness as much as 45 $\mu$m, requiring a long time to attain such a growth. However, the growth temperature decreases with time so that the p-type impurity Zn is captured into the growing layer in gradually decreasing amounts. Therefore, the resistance of the contact layer becomes higher as the growth progresses, so that the operating voltage of the semiconductor laser device becomes higher.

(4) The slider is pulled at an end of the growth of the contact layer so that the contact layer growth use fused liquid is removed from the substrate on which the semiconductor multilayer film has been grown, whereby the growth is terminated. This method may cause the bottom portion of the slider to be damaged by an edge growth portion of the contact layer that forms an extremely thin, high grown portion around the substrate. This in turn may cause growth defects to occur in the next and following growths.

(5) Generally in semiconductor laser devices, the active layer for use of laser beam oscillation is advantageously arranged in a generally center of an end surface from which the laser beam is emitted, in terms of improvement in characteristics, relaxation of stress applied to the active layer, improvement in the operating life, and the like. In the semiconductor laser device and its fabricating method such as shown in the prior art example, however, an attempt to arrange the active layer generally in the center would require the contact layer to be grown to a thickness as much as 45 $\mu$m, so that the p-type impurity Zn would be diffused into the lower semiconductor multilayer film during the growth. This may cause the semiconductor laser device to be deteriorated in characteristics, as still another problem.

SUMMARY OF THE INVENTION

The present invention has been developed with a view to substantially solving the above described disadvantages and has for its essential object to provide a semiconductor laser device having low operating voltage, long service life, and high performance and besides a method for fabricating the same.

In order to achieve the aforementioned object, there is provided a semiconductor laser device in which a semiconductor multilayer film including an $Al_yGa_{1-y}As$ active layer for use of laser beam oscillation is formed on a substrate, the semiconductor laser device comprising: a clad layer stacked on the semiconductor multilayer film and composed of p-type $Al_xGa_{l-x}As$ (where $0<y<x\ddot{y}1$) doped with Mg as a p-type impurity; and a contact layer stacked on the clad layer and composed of p-type GaAs doped with Mg as a p-type impurity.

Also, there is provided a method for fabricating a semiconductor laser device in which a semiconductor multilayer film including an $Al_yGa_{1-y}As$ active layer for use of laser beam oscillation is formed on a substrate, the method comprising the steps of: forming on the semiconductor multilayer film a clad layer composed of p-type $Al_xGa_{1-x}As$ (where $0<y<x\leqq1$) doped with Mg as a p-type impurity; and forming on the clad layer a contact layer composed of p-type GaAs doped with Mg as a p-type impurity.

Specifically, the present invention is characterized by the following (1) to (4) points:

(1) The semiconductor laser device comprises a clad layer composed of p-type AlGaAs doped with Mg instead of the conventional p-type impurity Zn, and a contact layer composed of p-type GaAs doped also with Mg as the p-type impurity.

Then, since Mg is lower in vapor pressure than Zn, the concentration of Mg in growth fused liquid is stabilized even if Mg is charged in the growth fused liquid.

Also, since the p-type impurity Mg is less diffused in the solid phase than Zn, the effect on the lower part semiconductor multilayer film is suppressed during the growth at high temperature.

(2) The active layer for use of laser beam oscillation is arranged in a substantially center of an end surface from which the laser beam is emitted.

Then, even if the semiconductor laser device of the present invention is applied to a minidisc player or the like, a light beam which is obliquely incident upon the minidisc through a grating and obliquely reflected from the minidisc is prevented from going back to the end surface from which the laser beam is emitted. Thus, occurrence of tracking errors can be prevented, because a stray light does not occur.

Also, since the semiconductor laser device itself can be made to have a large thickness, the wafer substrate can be prevented from cracking in the fabricating processes.

Further, since the active layer for use of laser beam oscillation is formed at a position farthest from both electrodes, the stress applied to the active layer in the mounting of the semiconductor laser device to external can be reduced.

(3) The method for fabricating the semiconductor laser device comprises a step of forming a clad layer composed of p-type AlGaAs doped with Mg as the p-type impurity, and a step of forming a contact layer composed of p-type GaAs doped with Mg as the p-type impurity. Also, the method uses an LPE growth process for forming the clad layer and the contact layer, and comprises a step of growing the contact layer from a growth start temperature to room temperature.

If the clad layer and the contact layer are formed by the LPE growth process and the contact layer is grown from a growth start temperature to room temperature as described above, then it is unnecessary to pull a slider at an end of the growth, so that the slider can be prevented from any damage at its bottom portion that would make a cause of growth defects.

(4) The method for fabricating the semiconductor laser device comprises a step of removing a surface layer having a high-resistance portion present in the contact layer and lower in carrier concentration than that of the other portion of the contact layer.

Also, the method comprises a step of removing the surface layer of the contact layer to an extent of a 5 μm or more thickness.

Since the surface layer having a high-resistance portion present in the contact layer and lower in carrier concentration than that of the other portion of the contact layer is removed or the surface layer of a 5 μm or more layer thickness is removed as described above, portion of the grown layer having increased resistance can be removed efficiently.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 8A, 8B, 8C, and 8D are procedure diagrams showing a method for fabricating the semiconductor laser device according to the prior art.

DETAILED DESCRIPTION OF THE PREFERRED EMBODIMENTS

Embodiments of the present invention are described with reference to the accompanying drawings. The Al mixed crystal ratio of an active layer and the Al mixed crystal ratio of a clad layer are set to 0.13 and 0.5, respectively, in the present embodiment. However, the Al mixed crystal ratios may be set to arbitrary ones only if they are within such a range that both are more than 0 and that the Al mixed crystal ratio of the clad layer is larger than the Al mixed crystal ratio of the active layer.

Figure 1:
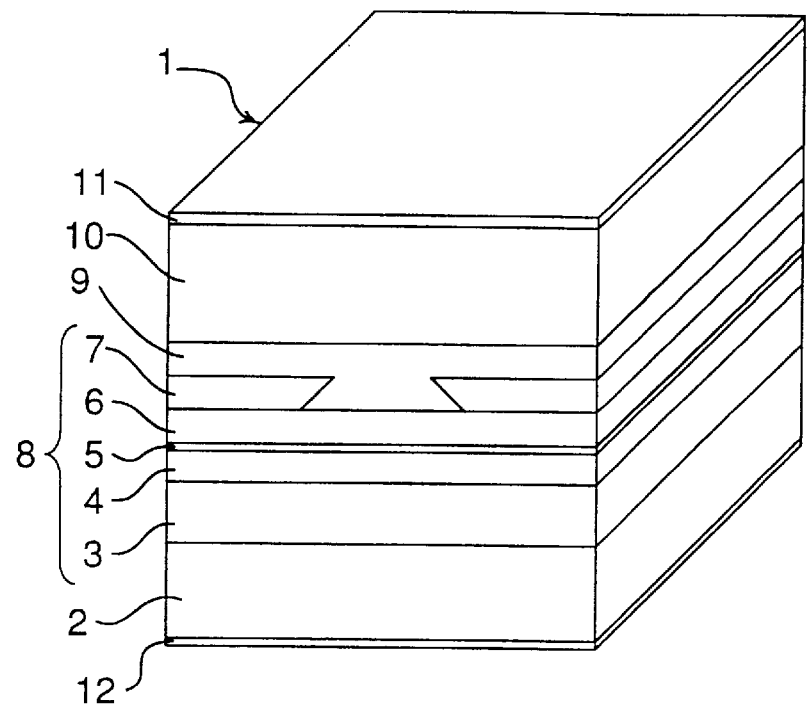
FIG. 1 is a perspective view of a semiconductor laser device according to an embodiment to which the present invention is applied.
Figure 7:
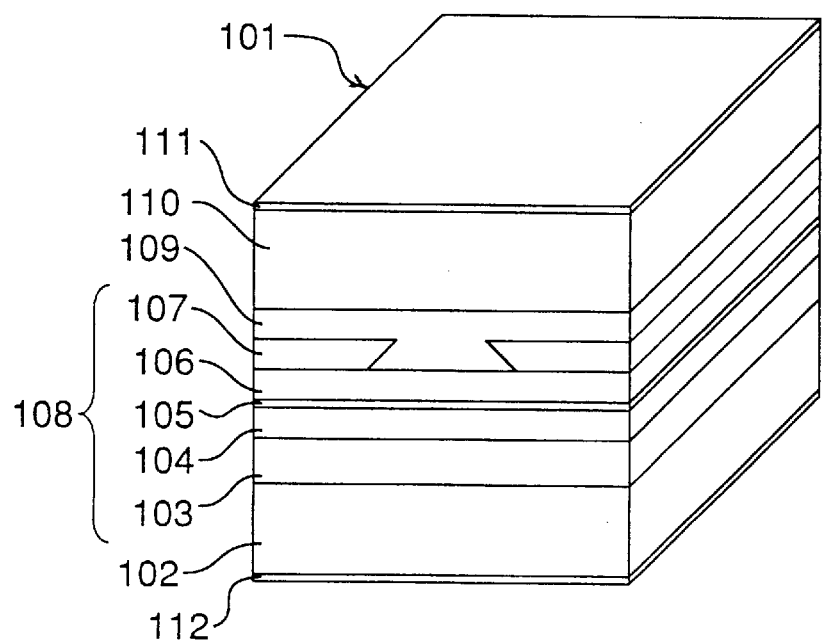
FIG. 7 is a perspective view of a semiconductor laser device according to the prior art.

FIG. 1 is a perspective view of a semiconductor laser device formed in the embodiment of the present invention.

A semiconductor laser device 1 of the present embodiment is constructed as follows. A semiconductor multilayer film 8 is stacked on a substrate 2 composed of, for example, n-type GaAs, the semiconductor multilayer film 8 being comprised of a buffer layer 3 composed of Se-doped n-type GaAs, a lower clad layer 4 composed of Se-doped n-type $Al_{0.5}Ga_{0.5}As$, an active layer 5 composed of $Al_{0.13}Ga_{0.87}As$, an upper clad layer 6 composed of Zn-doped p-type $Al_{0.5}Ga_{0.5}As$, and a current blocking layer 7 composed of Se-doped n-type AlGaAs. Further thereon stacked are a clad layer 9 composed of Mg-doped p-type $Al_{0.5}Ga_{0.5}As$ and a contact layer 10 composed of Mg-doped p-type GaAs, sequentially. On top and bottom surfaces of the semiconductor laser device, formed are a p electrode 11 and an n electrode 12 composed of, for example, Au—Ge and Au—Zn.

The method for fabricating the semiconductor laser device, which is an embodiment of the present invention, is described below.

FIGS. 2A, 2B, 2C, 2D and 2E are procedure diagrams showing the method for fabricating the semiconductor laser device according to the present embodiment.

Figure 2A:
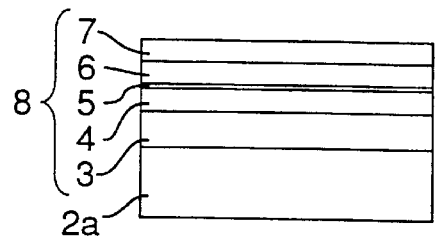
FIGS. 2A, 2B, 2C, 2D, and 2E are procedure diagrams showing a method for fabricating the semiconductor laser device according to the embodiment to which the present invention is applied.

First, as shown in FIG. 2A, a semiconductor multilayer film 8 is grown by an MOCVD (Metal Organic Chemical Vapor Deposition) process on a wafer substrate 2a composed of, for example, n-type GaAs, the semiconductor multilayer film 8 being comprised of a buffer layer (thickness 2 $\mu$m) 3 composed of Se-doped n-type GaAs, a lower clad layer (thickness 1 $\mu$m) 4 composed of Se-doped n-type $Al_{0.5}Ga_{0.5}As$, an active layer (thickness 0.08 $\mu$m) 5 composed of $Al_{0.13}Ga_{0.87}As$, an upper clad layer (thickness 0.3 $\mu$m) 6 composed of Zn-doped p-type $Al_{0.5}Ga_{0.5}As$, and a current blocking layer (thickness 1 $\mu$m) 7 composed of Se-doped n-type AlGaAs.

Figure 2B:
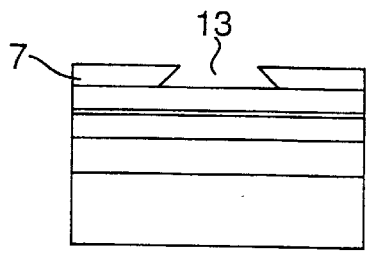

As shown in FIG. 2B, a stripe-shaped groove (top width approx. 4 $\mu$m) 13 is formed by etching so as to be bored through the current blocking layer 7.

Figure 2C:
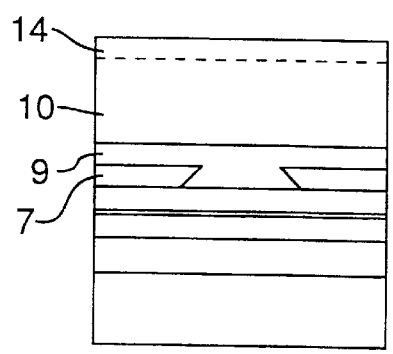

Then, as shown in FIG. 2C, a clad layer (thickness inside the stripe-shaped groove 2 $\mu$m, thickness outside 1 $\mu$m) 9 composed of Mg-doped p-type $Al_{0.5}Ga_{0.5}As$ and a contact layer (thickness 50 $\mu$m) 10 composed of Mg-doped p-type GaAs are sequentially grown by the LPE growth process.

Figure 2D:
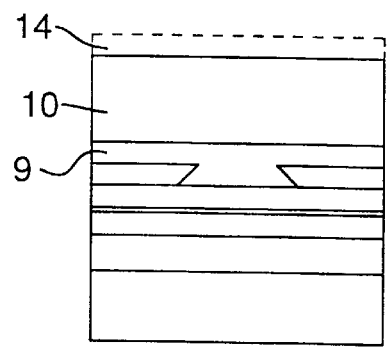

Further, as shown in FIGS. 2C and 2D, a high-resistance layer 14 near the surface of the contact layer 10 is removed by, for example, etching or mechanical grinding.

Figure 2E:
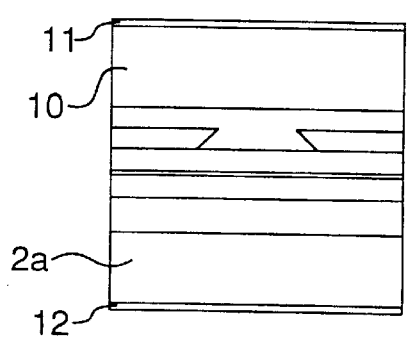

Finally, as shown in FIG. 2E, a positive electrode 11 and an n electrode 12 composed of, for example, Au—Ge and Au—Zn and so on are formed and thereafter the wafer is divided into individual semiconductor laser devices.

FIGS. 3A through 3D are process diagrams showing the steps of the LPE growth of the clad layer and the contact layer, which are one of the points of the present invention.

Figure 3A:
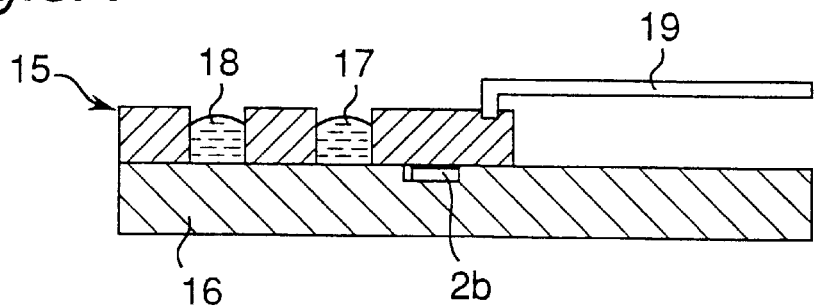
FIGS. 3A, 3B, 3C, and 3D are process diagrams showing the steps of LPE growth of the clad layer and the contact layer in the embodiment to which the present invention is applied.

As shown in FIG. 3A, the LPE growth is carried out by using a growth slide board 15 made of carbon. A substrate 2b on which the semiconductor multilayer film has been grown is set at a recess of a base 16. An LPE-grown clad layer growth use fused liquid 17 and a contact layer growth use fused liquid 18 are set in growth fused liquid sumps.

Figure 3B:
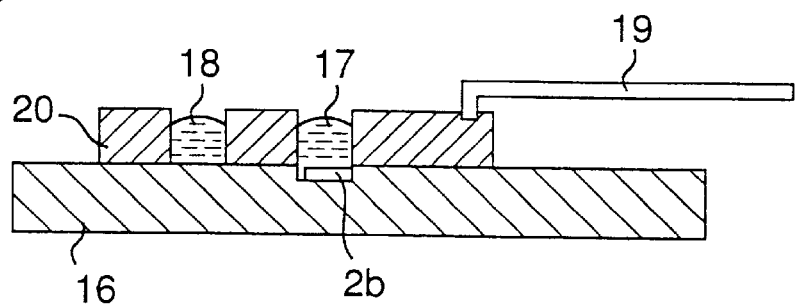

As shown in FIG. 3B, a slider 20 is pulled by a slide bar 19, so that the LPE-grown clad layer growth use fused liquid 17 is put into contact with the substrate 2b. Then, while the temperature is gradually lowered, the LPE growth of the clad layer is performed.

Figure 3C:
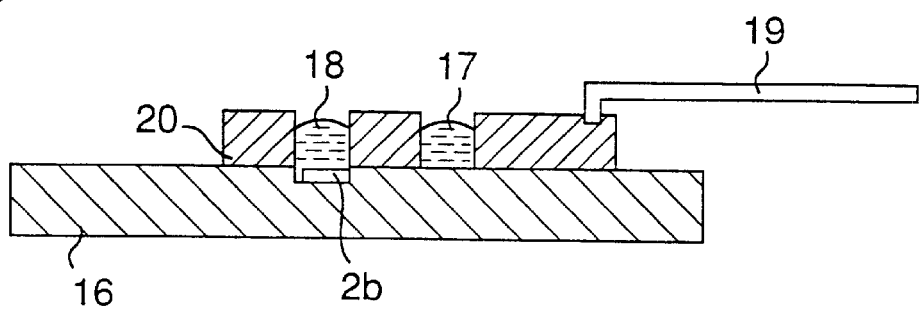

Further, as shown in FIG. 3C, at a time point when a specified time or temperature is reached, the slider 20 is pulled again by the slide bar 19, so that the contact layer growth use fused liquid 18 is put into contact with the substrate 2b. Then, while the temperature is gradually lowered, the LPE growth of the contact layer is carried out to room temperature. Thus, the growth is completed.

Figure 3D:
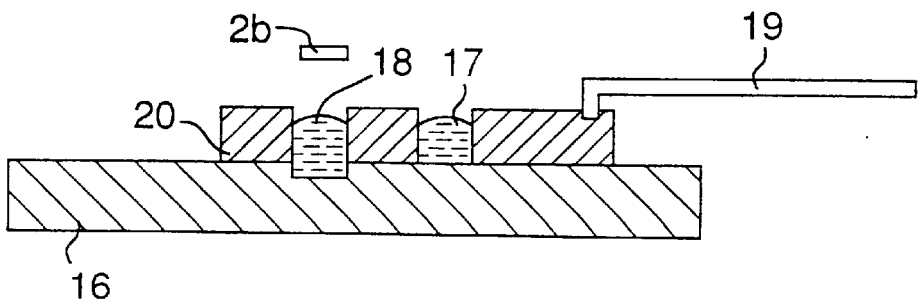

After the growth of the contact layer is completed, the substrate 2b can be taken out directly from within the contact layer growth use fused liquid 18 as shown in FIG. 3D. Therefore, even if an edge growth portion is grown around the substrate 2b in a very thin and high form, the bottom portion of the slider 20 is prevented from damage.

Figure 4:
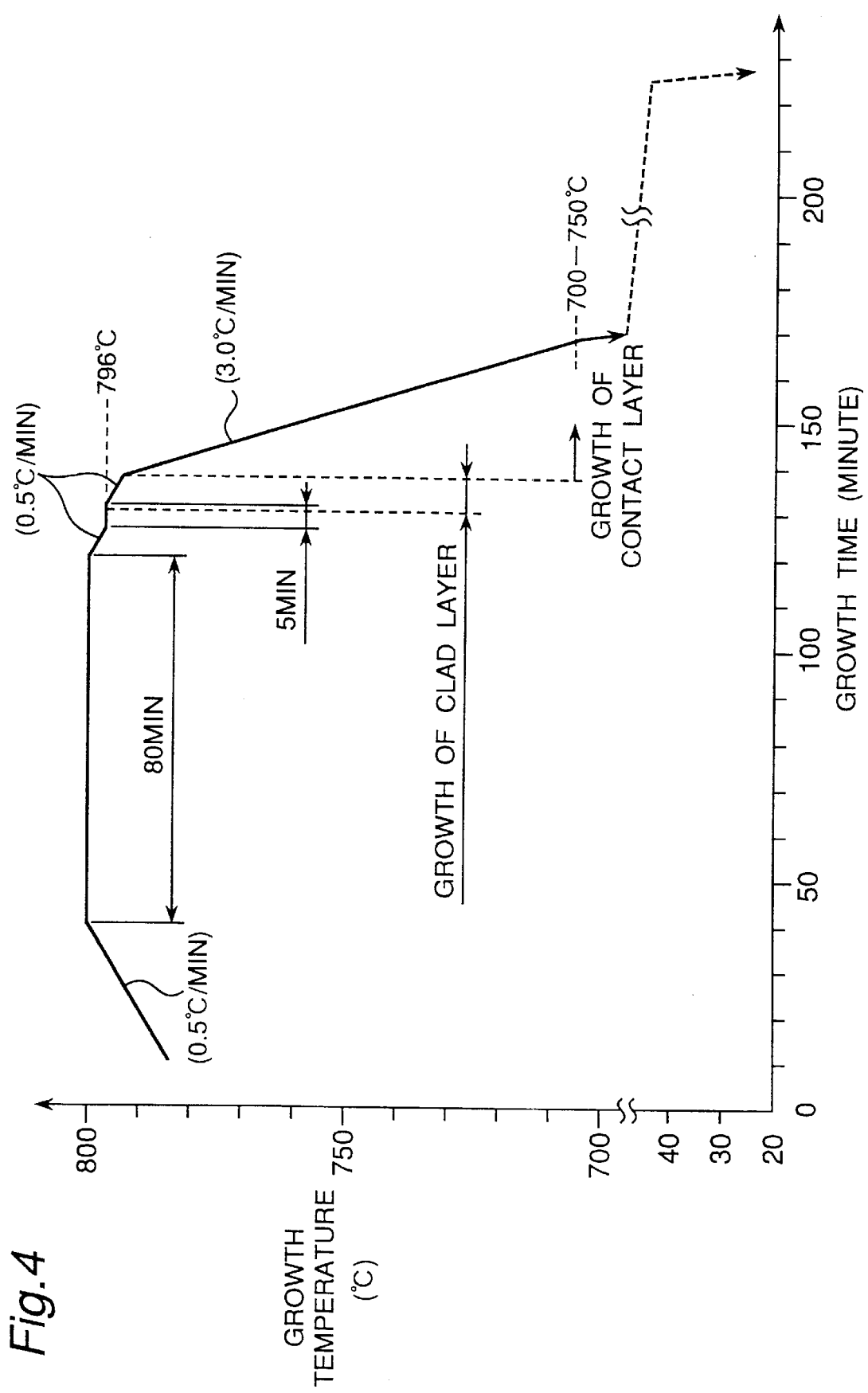
FIG. 4 is a growth temperature profile chart of the clad layer and the contact layer in the LPE growth process used in the embodiment to which the present invention is applied.

FIG. 4 is a growth temperature profile chart of the clad layer and the contact layer in the LPE growth process used in the present embodiment.

As apparent from FIG. 4, in the present embodiment, temperature is increased up to 800° C. at a rate of 0.5° C./min, and thereafter the temperature is maintained at 800° C. for 80 min with a view to well dissolving Al, GaAs, which is the supply source of As, p-type impurity Mg, and the like into Ga, which becomes a solvent in the LPE growth fused liquid, and besides stabilizing the dissolution. Next, gradual cooling is done to 796° C., which is the growth start temperature for the clad layer, at a rate of 0.5° C./min, and thereafter the temperature is maintained at 796° C. for 5 min to allow the temperature of the LPE growth fused liquid to be stabilized, where the LPE growth of the clad layer is started. Further, while the temperature is gradually lowered at a rate of 0.5° C./min, the LPE growth of the clad layer is performed. Subsequently, the contact layer is LPE grown while the temperature is firstly lowered gradually to the temperature of 700–750° C. at a rate of 3.0° C./min and then rapidly lowered to the room temperature.

It is needless to say that the LPE growth temperature may be set arbitrarily within a range of about 700 to 850° C., and the growth temperature profile may also be set arbitrarily depending on the growth conditions.

Figure 5:
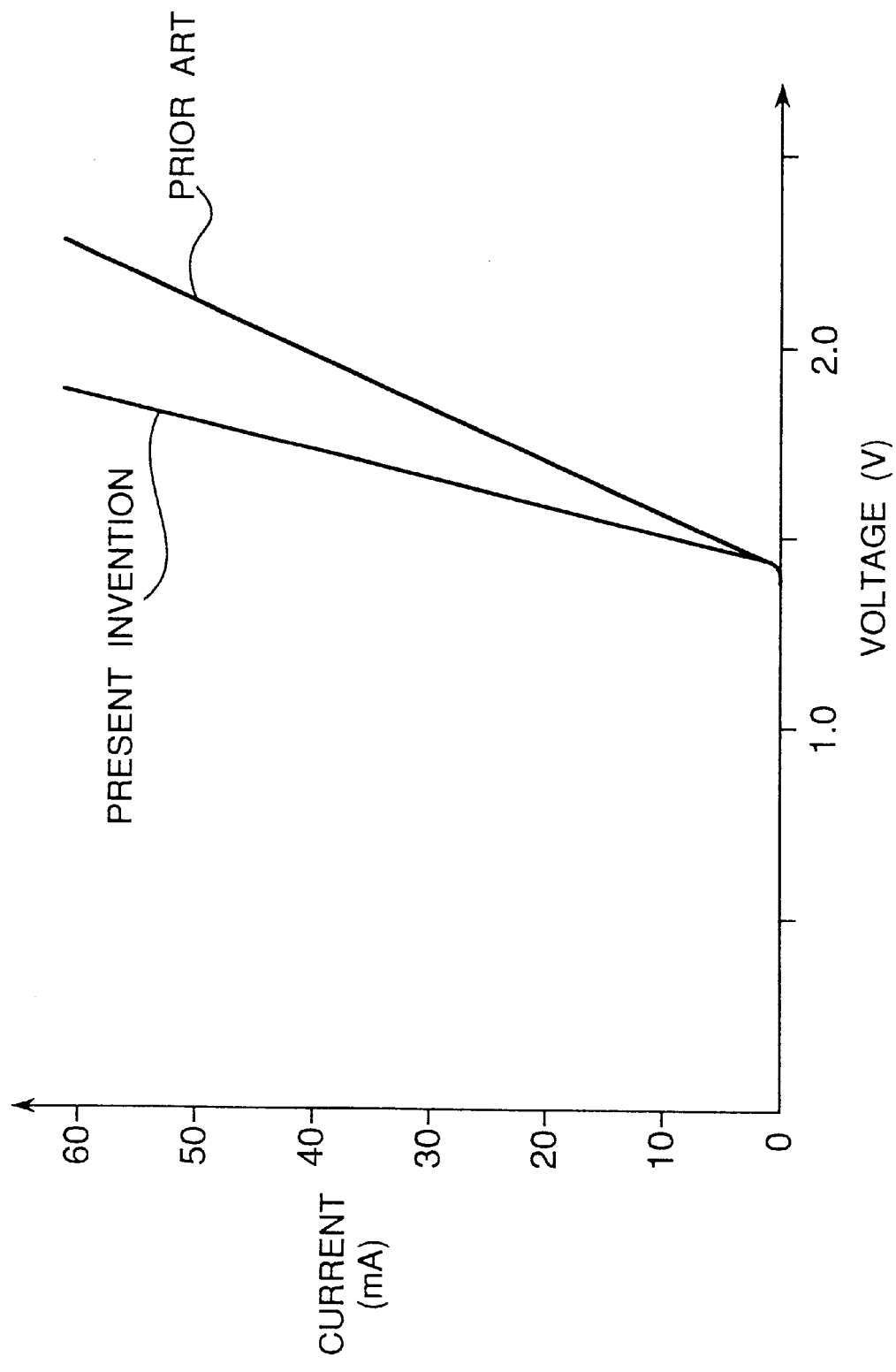
FIG. 5 is an I-V characteristic chart in comparison between the semiconductor laser device obtained in the embodiment to which the present invention is applied, and a semiconductor laser device of the prior art.

FIG. 5 is an I-V characteristic (current-voltage characteristic) chart in comparison between the semiconductor laser device according to the present embodiment, and a semiconductor laser device according to the prior art.

As compared with the I-V characteristic of the prior art semiconductor laser device using a contact layer composed of p-type GaAs doped with the conventional p-type impurity Zn, the I-V characteristic of the invention semiconductor laser device using a contact layer composed of p-type GaAs doped with the p-type impurity Mg of the present invention has been improved.

Figure 6:
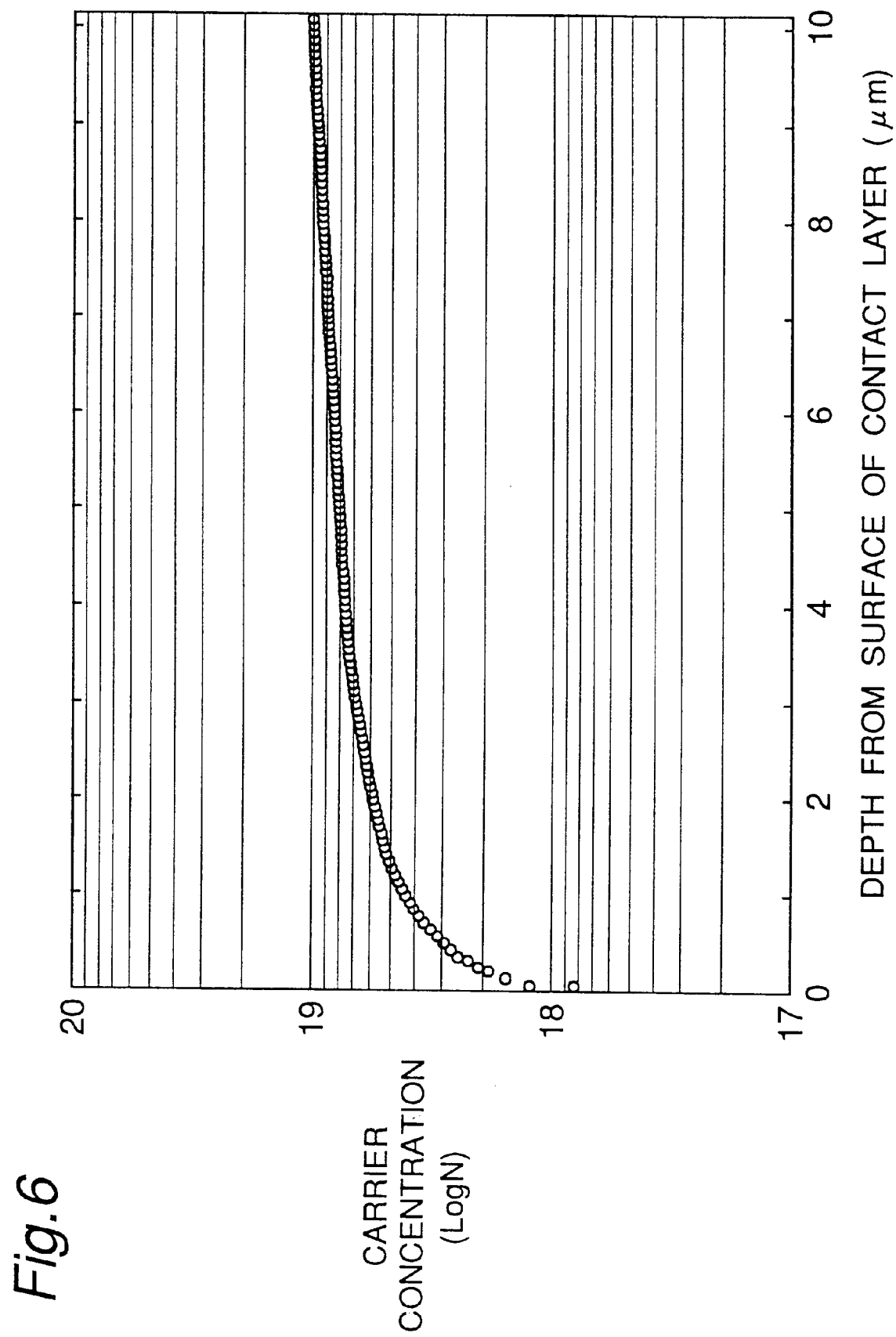
FIG. 6 is a carrier concentration profile chart in the contact layer of the semiconductor laser device obtained in the embodiment to which the present invention is applied.
Figure 9A:
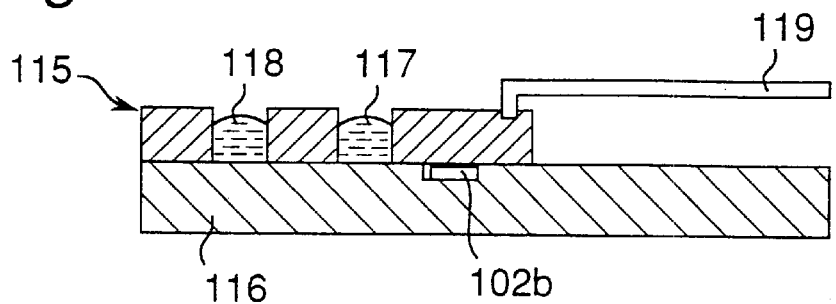
FIGS. 9A, 9B, 9C, and 9D are process diagrams showing the steps of LPE growth of the clad layer and the contact layer in the prior art.
Figure 9B:
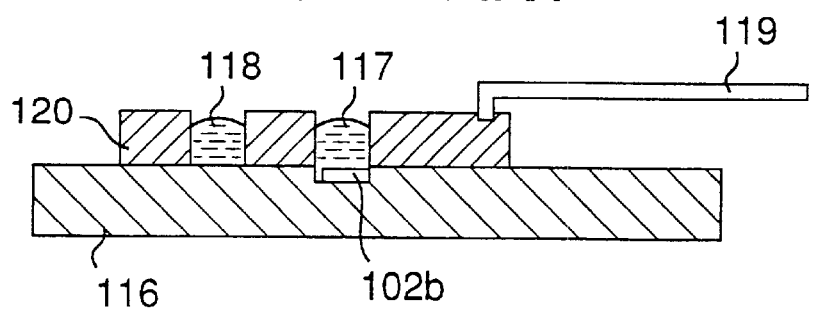
Figure 9C:
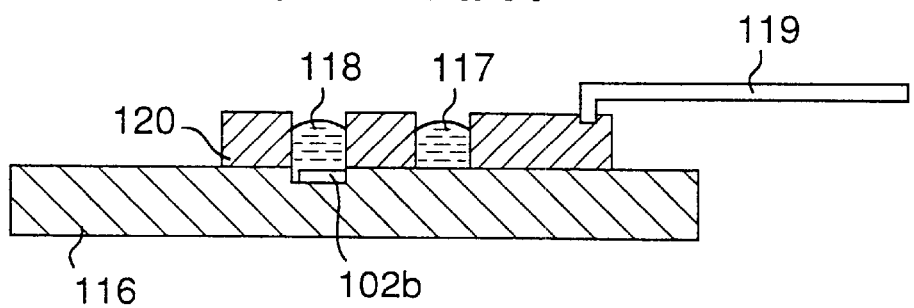
Figure 9D:
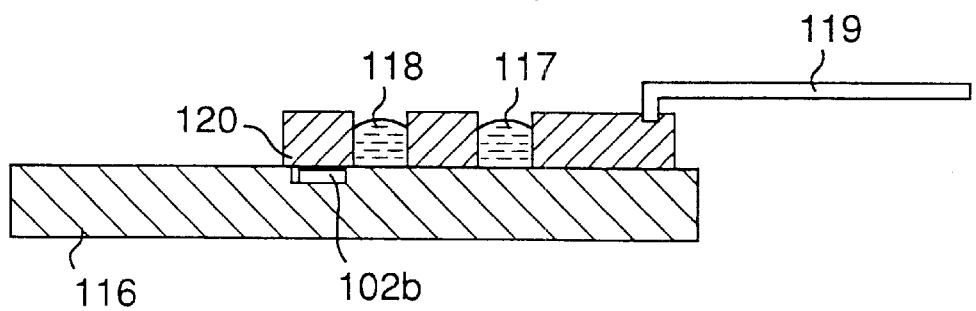

FIG. 6 is a carrier concentration profile chart in the contact layer of the semiconductor laser device obtained in the present embodiment.

As apparent from FIG. 6, the carrier concentration of the contact layer gradually decreases from the initial approximately $1 \times 10^{19}$ cm$^{-3}$ in a direction toward the surface of the contact layer, such that the carrier concentration decreases to approximately $7 \times 10^{18}$ cm$^{-3}$ at a depth of about 5 $\mu$m from the surface. Furthermore, the carrier concentration tends to begin abruptly dropping at a depth of about 2 $\mu$m from the surface.

In the present embodiment, the carrier concentration that ensures an operating voltage equivalent to the prior art semiconductor laser device is approximately $7 \times 10^{18}$ cm$^{-3}$.

Therefore, in order to remove the high-resistance layer in proximity to the surface of the contact layer in the present embodiment, it is sufficient to remove the contact layer surface to a thickness of about 5 μm.

According to the present invention, (1) The semiconductor laser device is made using a clad layer composed of p-type AlGaAs doped with Mg instead of Zn as the p-type impurity, and a contact layer composed of p-type GaAs doped with Mg instead of Zn. Since Mg is lower in vapor pressure than Zn, its concentration in the fused liquid is stabilized even if Mg is charged in the growth fused liquid.

Accordingly, the composition of the grown layer is easy to control.

Also, since the p-type impurity Mg is less diffused in the solid phase than Zn, the effect on the lower part semiconductor multilayer film is suppressed during the growth at high temperature.

It is possible to obtain desired design characteristics of the device.

(2) The clad layer and the contact layer are formed by the LPE growth process and moreover the contact layer is grown from the growth start temperature to room temperature, eliminating the need of pulling the slider of the growth slide board at an end of growth. Accordingly, the bottom portion of the slider is not damaged by an edge growth portion that is grown around the substrate to an extremely thin, high growth, during the growth of the contact layer.

The slider is reusable repeatedly for the next and following growths.

(3) Since the surface layer having a high-resistance portion present in the contact layer and low in carrier concentration is removed or the surface layer is removed to a 5 μm or more layer thickness, the portion of the grown layer having increased resistance is removed efficiently.

The operating voltage of the semiconductor laser device is not elevated and can be reduced, so that I-V characteristic improvement is feasible.

(4) The active layer for use of laser beam oscillation is arranged generally in the center of the end surface from which the laser beam is emitted. Even if the semiconductor laser device of the present invention is applied to a minidisc player or the like, a light beam which is obliquely incident upon the minidisc through a grating and obliquely reflected from the minidisc is prevented from going back to the end surface from which the laser beam is emitted, so that occurrence of tracking errors is prevented, because a stray light does not occur.

Also, since the thickness of the semiconductor laser device itself can be made thick, the wafer substrate can be prevented from cracking in the fabricating processes.

Further, since the active layer for use of laser beam oscillation is formed at a position farthest from both electrodes, the stress applied to the active layer in the mounting of the semiconductor laser device to external is reduced.

Accordingly, the operating life of the semiconductor laser device is improved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device of the type comprising a stacking of films in which a semiconductor multilayer film including an $Al_yGa_{1-y}As$ active layer for use of laser beam oscillation is formed on a substrate, the semiconductor laser device comprising:

a clad layer stacked on the semiconductor multilayer film and composed of p-type $Al_xGa_{1-x}As$ (where $0 \leq y < x \leq 1$) doped with Mg as a p-type impurity; and a contact layer stacked on the clad layer and composed of p-type GaAs doped with Mg as a p-type impurity.

2. The semiconductor laser device according to claim 1, wherein the active layer is arranged in a substantially center of the semiconductor laser device in a stacking direction of the films.

* * * * *